United States Patent
Geurts et al.

(10) Patent No.: US 11,355,305 B2
(45) Date of Patent: Jun. 7, 2022

(54) LOW KEV ION BEAM IMAGE RESTORATION BY MACHINE LEARNING FOR OBJECT LOCALIZATION

(71) Applicant: FEI Company, Hillsboro, OR (US)

(72) Inventors: Remco Johannes Petrus Geurts, Eindhoven (NL); Pavel Potocek, Eindhoven (NL); Maurice Peemen, Eindhoven (NL); Ondrej Machek, Brno (CZ)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/596,538

(22) Filed: Oct. 8, 2019

(65) Prior Publication Data
US 2021/0104375 A1    Apr. 8, 2021

(51) Int. Cl.
*H01J 37/20*     (2006.01)
*H01J 37/22*     (2006.01)
*G06N 3/08*      (2006.01)
*H01J 37/26*     (2006.01)
*H01J 37/305*    (2006.01)

(52) U.S. Cl.
CPC .............. *H01J 37/222* (2013.01); *G06N 3/08* (2013.01); *H01J 37/20* (2013.01); *H01J 37/26* (2013.01); *H01J 37/3053* (2013.01); *H01J 2237/221* (2013.01); *H01J 2237/31737* (2013.01); *H01J 2237/31749* (2013.01)

(58) Field of Classification Search
CPC ...... H01J 37/222; H01J 37/3053; H01J 37/26; H01J 37/20; H01J 2237/221; H01J 2237/31737; H01J 2237/31749; G06N 3/08
See application file for complete search history.

(56) References Cited

U.S. PATENT DOCUMENTS

| | | | |
|---|---|---|---|
| 10,068,749 B2 * | 9/2018 | Fuller | H01J 37/3026 |
| 2007/0019887 A1 * | 1/2007 | Nestares | G06T 3/4053 |
| | | | 382/299 |

(Continued)

FOREIGN PATENT DOCUMENTS

WO    WO-2019188009 A1    10/2019

OTHER PUBLICATIONS

Dhawan A P et al., "Neural Model-Based Approach to Image Enhancement", Optical Engineering, Soc. of Photo-Optical Instrumentation Engineers, Bellingham, vol. 33, No. 4, Apr. 1, 1994 (Apr. 1, 1994), pp. 1156-1164, XP000440054, ISSN: 0091-3286, DOI: 10.1117/12.166903.

(Continued)

*Primary Examiner* — Wyatt A Stoffa

(57) ABSTRACT

Methods and systems for creating TEM lamella using image restoration algorithms for low keV FIB images are disclosed. An example method includes irradiating a sample with an ion beam at low keV settings, generating a low keV ion beam image of the sample based on emissions resultant from irradiation by the ion beam, and then applying an image restoration model to the low keV ion beam image of the sample to generate a restored image. The sample is then localized within the restored image, and a low keV milling of the sample is performed with the ion beam based on the localized sample within the restored image.

20 Claims, 4 Drawing Sheets

(56) References Cited

U.S. PATENT DOCUMENTS

| | | | | |
|---|---|---|---|---|
| 2013/0214468 A1* | 8/2013 | Giannuzzi | ............... | G01N 1/00 |
| | | | | 269/287 |
| 2013/0228683 A1* | 9/2013 | Boughorbel | .......... | H01J 37/261 |
| | | | | 250/307 |
| 2013/0319849 A1* | 12/2013 | Fuller | ..................... | G01N 1/32 |
| | | | | 204/192.34 |
| 2014/0061032 A1* | 3/2014 | Miller | ................. | H01J 37/3056 |
| | | | | 204/192.33 |
| 2014/0302252 A1* | 10/2014 | Mulders | ............. | H01J 37/3053 |
| | | | | 427/523 |
| 2015/0179402 A1* | 6/2015 | Kelley | .................... | G01N 1/32 |
| | | | | 204/192.34 |
| 2015/0255248 A1* | 9/2015 | Boguslavsky | ........... | G01N 1/32 |
| | | | | 204/192.34 |
| 2015/0270102 A1 | 9/2015 | Asahata et al. | | |
| 2016/0126060 A1* | 5/2016 | Fuller | ................ | H01J 37/3005 |
| | | | | 250/492.3 |
| 2019/0172680 A1* | 6/2019 | Fuller | ................ | H01J 37/3005 |
| 2019/0272975 A1 | 9/2019 | Brogden et al. | | |
| 2020/0126201 A1* | 4/2020 | Harada | .................. | H01J 37/20 |

OTHER PUBLICATIONS

EP20200687.0, Partial European Search Report, dated Feb. 19, 2021, 12 pages.
Pique et al., "Direct-Write Technologies for Rapid Prototyping Applications", 1st Edition, Sensors, Electronics, and Integrated Power Sources, Academic Press, Oct. 15, 2001 (Oct. 15, 2001), pp. XIX-726, XP040425671, ISBN: 978-0-12-174231-7.

* cited by examiner

LOW KEV ION BEAM IMAGE RESTORATION BY MACHINE LEARNING FOR OBJECT LOCALIZATION

BACKGROUND OF THE INVENTION

Sample preparation for examination with a transmission electron microscope (TEM) is the process of creating a TEM lamella from a larger sample material. This involves milling regions of the sample material so that a TEM lamella is created that has a thickness that allows electrons from an incident electron beam to pass through, thus enabling evaluation and/or analysis with a TEM system. However, the process of milling away regions of the sample material proximate to the TEM lamella causes damage to the surface of the TEM lamella (e.g., via deposition and/or removal of surface features). To prevent such surface damage from negatively effecting the evaluation and/or analysis of the TEM lamella, a final step in current TEM sample preparation protocols is the application of a low keV polish with a focused ion beam (FIB).

In order to evenly apply the low keV polish, either an expert user or computer automation software must localize an edge of the TEM lamella. Unfortunately, in current TEM systems locating the edge of the TEM lamella is difficult due to the low quality images that are captured with a low keV FIB. Moreover, increasing the voltage of the FIB during the image capturing process causes further damage to the TEM lamella. Because of this, a disproportional amount development costs for current FIB systems are spent to improve optical capabilities at low keV energies. Not only does this increase production costs, but it also limits the resources that can be directed to other optical capabilities of the system.

SUMMARY

Methods and systems for creating TEM lamella using image restoration algorithms for low keV FIB images are disclosed. An example method includes irradiating a sample with an ion beam at low keV settings, generating a low keV ion beam image of the sample based on emissions resultant from irradiation by the ion beam, and then applying an image restoration model to the low keV ion beam image of the sample to generate a restored image. The sample is then localized within the restored image, and a low keV milling of the sample is performed with the ion beam based on the localized sample within the restored image. The methods may further include training the image restoration model, an image recognition module, and/or component machine learning algorithm(s) thereof. Such training may be conducted based on a training set of one or more labeled images of similar and/or identical samples.

Systems for automatically orienting a sample in the microscope system, comprise a sample holder configured to hold a sample, an ion source configured to irradiate the sample with an ion beam, and an imaging system configured to capture images of the sample based on charged particles emitted by the sample in response to being irradiated with the ion beam. Systems according to the present disclosure further include one or more processing units, and a memory storing computer readable instructions that, when executed by the one or more processing units, cause the charged particle microscope system to perform methods for creating TEM lamella using image restoration algorithms for low keV FIB images according to the present disclosure.

BRIEF DESCRIPTION OF THE DRAWINGS

The detailed description is described with reference to the accompanying figures. In the figures, the left-most digit(s) of a reference number identify the figure in which the reference number first appears. The same reference numbers in different figures indicates similar or identical items.

Figure 1:
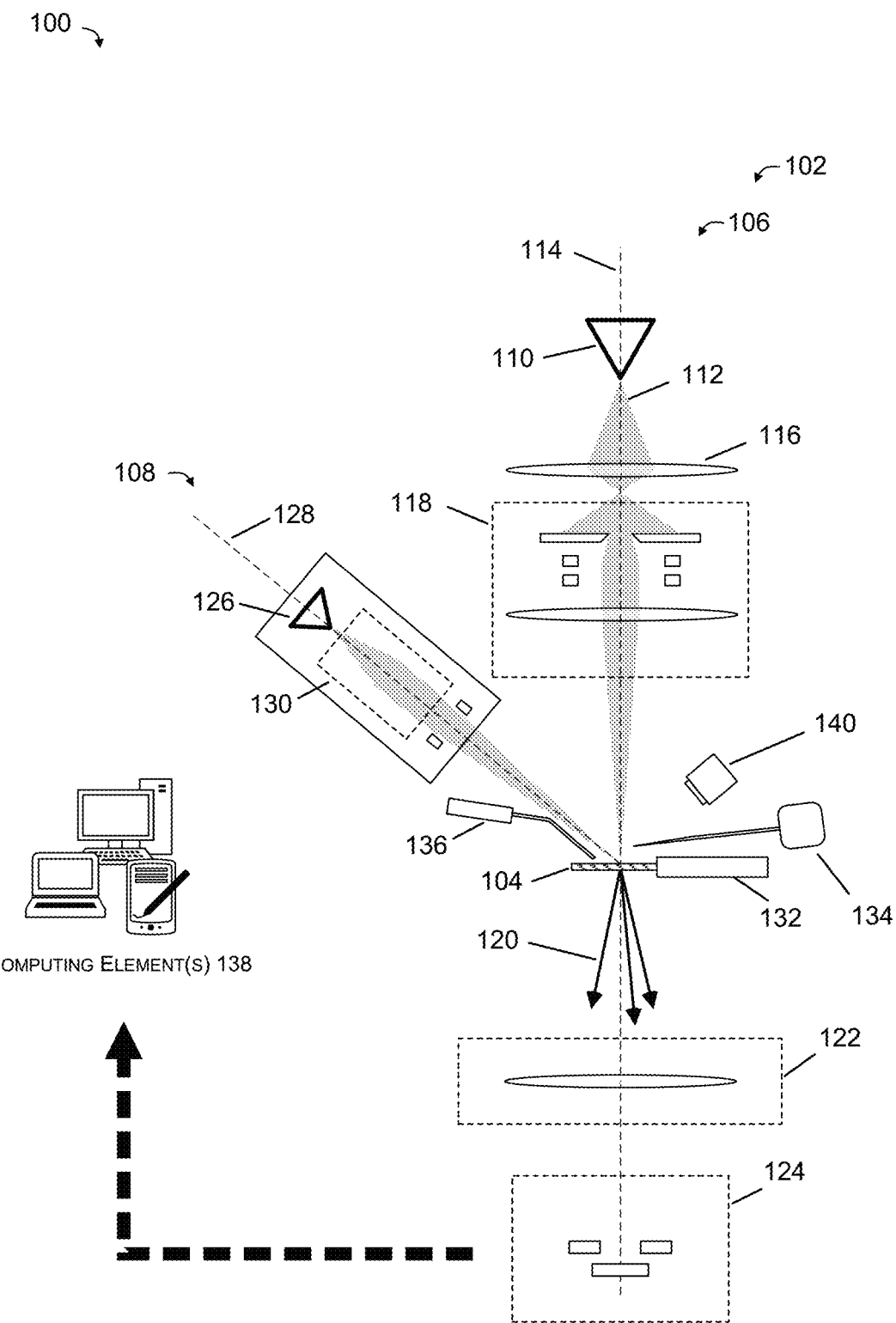
FIG. 1 illustrates example charged particle environment for TEM lamella preparation using image restoration algorithms for low keV FIB images in a charged particle system, according to the present invention.

Like reference numerals refer to corresponding parts throughout the several views of the drawings. Generally, in the figures, elements that are likely to be included in a given example are illustrated in solid lines, while elements that are optional to a given example are illustrated in broken lines. However, elements that are illustrated in solid lines are not essential to all examples of the present disclosure, and an element shown in solid lines may be omitted from a particular example without departing from the scope of the present disclosure.

DETAILED DESCRIPTION OF EMBODIMENTS

Methods and systems for creating TEM lamella using image restoration algorithms for low keV FIB images are disclosed herein. More specifically, the disclosure includes improved methods and systems that utilize machine learning algorithms to improve the clarity of images captured with low keV FIB irradiation. This allows for easier lamella localization and more accurate low keV polishing over prior TEM lamella preparation processes. By overcoming these localization and accuracy challenges faced by prior TEM lamella preparation systems, the methods and systems according to the present invention also allow for reliable automation of the TEM lamella preparation process that was previously impossible. However, this is only an illustration of a particular application of the invention disclosed herein, and the methods and system may be used to improve the resolution of low keV FIB images for other applications.

One solution to the above disclosed problem includes using a low keV FIB to capture an image of a TEM lamella within a charged particle microscope system during the TEM lamella preparation process, and then applying a neural network image processing to create an improved low keV FIB image having greater resolution. The TEM lamella can then be localized within the improved low keV FIB image, which allows a low keV polishing step to be applied the TEM lamella within the charged particle microscope system. In some embodiments, the improved low keV FIB image allows a neural network algorithm to locate the TEM lamella and then automatically place and/or select a low keV polishing pattern.

FIG. 1 is an illustration of example charged particle environment 100 for TEM lamella preparation using image restoration algorithms for low keV FIB images in a charged particle system 102, according to the present invention. Specifically, FIG. 1 shows example charged particle environment 100 as including example charged particle system(s) 102 for preparation, evaluation, and/or analysis of a sample 104. The sample 104 may be a naturally occurring sample (e.g., biological sample, material sample, etc.), or a prepared sample (TEM lamella, integrated circuit, etc.). The example charged particle system(s) 102 is shown as being a dual beam system that includes a transmission electron microscope system 106 and a focused ion beam system 108. However, in other embodiments the system may be or include one or more different types of optical, and/or charged particle microscopes.

The transmission electron microscope system 106 includes an electron source 110 that emits an electron beam 112 along an emission axis 114 and towards an accelerator lens 116. The emission axis 112 is a central axis that runs along the length of the transmission electron microscope system 106 from the electron source 110 and through the sample 104. The accelerator lens 116 accelerates/decelerates, focuses, and/or directs the electron beam 112 towards a focusing column 118. The focusing column 118 focuses the electron beam 112 so that it is incident on at least a portion of the sample 104. In some embodiments, the focusing column 118 may include one or more of an aperture, scan coils, and upper objective lens. For example, the focusing column 118 is configured to focus electrons from electron source 110 into a small spot on the sample 104. Different locations of the sample 104 may be scanned by adjusting the electron beam direction via the scan coils. Additionally, the focusing column 118 may correct and/or tune aberrations (e.g., geometric aberrations, chromatic aberrations) of the electron beam 112.

Electrons 120 passing through sample 104 may enter projector 122. In one embodiment, the projector 122 may be a separate part from the focusing column 118. In another embodiment, the projector 122 may be an extension of the lens field from a lens in focusing column 118. The projector 122 may be adjusted so that direct electrons 120 passed through the sample 104 impinge on a microscope detector system 122.

In FIG. 1, the microscope detector system 124 is illustrated as including a disk-shaped bright field detector and dark field detector(s). In some embodiments, the microscope detector system 124 may include one or more other detectors. Alternatively, or in addition, the microscope detector system 124 may include a scanning electron microscope detector system, a focused ion beam detector system, a scanning electron microscope secondary electron detector system, a focused ion beam secondary electron detector system, and an optical microscope detector system.

FIG. 1 illustrates the focused ion beam system 108 as including a charged particle source 126 that is configured to emit a charged particle beam 128 along in ion emission axis 130 towards an ion focusing column 130. The ion emission axis 130 is a central axis that runs along the length of the focused ion beam system 108 from the charged particle source 126 and through the sample 104. The ion focusing column 130 is configured to focus the charged particle beam 128 so that it is incident upon a region of the sample 104. In some embodiments, the ion focusing column 130 may include one or more of an aperture, scan coils, and upper objective lens. For example, the ion focusing column 130 is configured to focus ions from charged particle source 126 into a small spot on the sample 104. The focused ion beam system 108 is configured to irradiate and/or mill the sample 104 with charged particles. Different locations of the sample 104 may be irradiated and/or milled away by adjusting the charged particle beam direction via the scan coils. Additionally, the size of the spot on the sample 104 that is irradiated and/or milled can be adjusted by the ion focusing column 130. The focused ion beam system 108 is able to operate at multiple voltage settings, including a low keV mode (e.g., where the focused ion beam system 108 is set to operate with operating values at or below 200 eV, 500 eV, 1 keV, 2 keV, 5 keV, 8 keV, and/or 16 keV) and a high keV mode (e.g., where the focused ion beam system 108 is set to operate with second operating values at or above 16 keV, 30 keV, and/or 50 keV).

FIG. 1 further illustrates the example charged particle system(s) 102 as further including a sample holder 132, a sample manipulation probe 134, a chemistry delivery unit 136, computing devices 138, and one or more imaging sensor(s) 140. The sample holder 132 is configured to hold the sample 104, and is able to translate, rotate, and/or tilt the sample 104 in relation to the charged particle system 102. Similarly, the sample manipulation probe 134 is configured to hold, transport, and/or otherwise manipulate the sample 104. The imaging sensor(s) 140 are configured to detect sensor data based on emissions resultant from the sample 104 being irradiated with the charged particle beam 128. In some embodiments, the irradiating the sample includes scanning the charged particle beam imaging such that it is moved across the sample. To prevent damage to the sample 104 (e.g., an Atomprobe, a TEM Tomography sample prep, a lamella, chunk, dogbone, phonebook, a TEM lamella, TEM lamella with one or more windows, etc.), the focused ion beam system 108 operates in a low keV mode when irradiating the sample 104 for imaging. The computing devices 138 are configured to then generate images of the sample 104 based on the sensor data from the imaging sensor(s) 140. In some embodiments, the images are gray-scale images that show contrasts indicative of the shape and/or the materials of the sample. Unfortunately, because the focused ion beam system 108 operates in a low keV mode when irradiating the sample 104 for imaging, the images generated by the computing devices 138 have low detail and/or resolution.

According to the present invention, the charged particle system 102 may be configured to generate and analyze TEM lamella via a lamella prep process. That is, the charged particle system 102 may be configured to produce a TEM lamella from a larger source material. For example, the focused ion beam system 108 can mill away portions of the source material that surround the TEM lamella (i.e., remove portions of the source material so that the TEM lamella remains. The sample manipulation probe 134 may then be attached to the TEM lamella using the chemistry delivery unit 136, and the focused ion beam system 108 may further mill and/or cut away portions of the source material so that the TEM lamella is no longer connected with the source material. The sample manipulation probe 134 may then translate and/or reorient the TEM lamella within the charged particle system 102. The TEM lamella may then be attached to the sample holder 132 for polishing and analysis. Alternatively, the TEM lamella may be polished and/or analyzed while attached to the sample manipulation probe 134. Because the focused ion beam system operates in a high keV mode when milling, the higher energy charged particle beam may cause damage to the surface of the TEM lamella during milling of the portions of the source material. Additionally, the milling may cause deposits on the surface of the TEM lamella resulting from portions of the source material being milled way.

Polishing the TEM lamella comprises the focused ion beam system 108 operating in a low keV mode and irradiating the TEM lamella with a low power charged particle beam that only removes a small amount of material from the TEM lamella. In this way, the damaged portions and/or deposits on the surface that are created during the production (i.e., milling) of the TEM lamella are removed. Once polished, the TEM lamella may be analyzed with the transmission electron microscope system 106.

The process of polishing the TEM lamella involves locating the TEM lamella, and then identifying the area that is to be subjected to a low keV mode charge particle beam. In some embodiments, this comprises identifying the location of the TEM lamella in one or more images generated by the computing devices 138 are configured based on the sensor data from the imaging sensor(s) 140, and then selecting a region of the image that corresponds to the area that is to be irradiated by the focused ion beam system operates 108 while it operates in a low keV mode.

The TEM lamella may be located within such an image manually by a user, or may be automatically detected by computing devices 128, or a combination thereof. For example, the computing devices 128 may estimate a location of the TEM lamella in an image, and then present a graphical user interface to user that identifies the estimated location and prompts the user for verification. Determining the location of the TEM lamella in the image may include determining the position and/or orientation of the TEM lamella in the image.

However, as discussed above, because the focused ion beam system 108 operates in a low keV mode when irradiating the TEM lamella for imaging, the images generated by the computing devices 138 have low detail and/or resolution. This means that it is very difficult to determine the precise location of the TEM lamella in the generated images. The systems and methods presented herein overcome this difficulty by applying one or more image restoration models to the images to generate restored versions of the images. The image restoration models correspond to machine learning models (e.g., artificial neural network, convolutional neural network, recurrent neural network, supervised model, unsupervised model, etc.) that have been trained to restore an image generated using a focused ion beam system 108 operating in a low keV mode such that the restored images have increased detail and/or resolution. In some embodiments, the computing devices 138 are configured to determine the best algorithm and/or collection of algorithms to apply to a particular image based on features of the image, settings of the microscope system 102, or both. Once the image restoration model generates such a restored image, the computing devices 138 are able to identify features in the image (e.g., shadows, edges, fiducials, boundaries, structures, background features, sample 104 features, etc.), the location of the TEM lamella in the restored image, or both. For example, the computing devices 138 may first identify features within the restored image, and then determine the location of the TEM lamella in the restored image based on the identified features.

Once the location of the TEM lamella is determined, a region of the restored image that depicts an area that is to be subjected to polishing by the focused ion beam system operates 108 is determined. This may include associating such a region of the restored image with a low energy mill mapping. The low energy mill mapping describes the region of the image that is to be subjected to polishing by the focused ion beam system 108. In some embodiments, the low energy mapping corresponds to coordinates that identify the pixels of the image that are included within the region, the boundaries of the region, etc. Alternatively, or in addition, the low energy mapping may be a graphic that is overlaid onto the restored image by a user, a computer algorithm, or a combination thereof. For example, a machine learning algorithm may overlay the low energy mapping graphic over the restored image based on the on ore more features identified in the image. Alternatively, the computing system 138 may present a graphical user interface that allows a user to place the low energy mapping graphic on the restored image, or approve the positioning of the low energy mapping graphic as overlaid automatically by the machine learning algorithm.

Those skilled in the art will appreciate that the computing devices 138 depicted in FIG. 1 are merely illustrative and are not intended to limit the scope of the present disclosure. The computing system and devices may include any combination of hardware or software that can perform the indicated functions, including computers, network devices, internet appliances, PDAs, wireless phones, controllers, oscilloscopes, amplifiers, etc. The computing devices 128 may also be connected to other devices that are not illustrated, or instead may operate as a stand-alone system. In addition, the functionality provided by the illustrated components may in some implementations be combined in fewer components or distributed in additional components. Similarly, in some implementations, the functionality of some of the illustrated components may not be provided and/or other additional functionality may be available.

It is also noted that the computing device(s) 138 may be a component of the example charged particle system(s) 102, may be a separate device from the example charged particle system(s) 102 which is in communication with the example charged particle system(s) 102 via a network communication interface, or a combination thereof. For example, an example charged particle system(s) 102 may include a first computing device 138 that is a component portion of the example charged particle system(s) 102, and which acts as a controller that drives the operation of the example charged particle system(s) 102 (e.g., adjust the scanning location on the sample 104 by operating the scan coils, etc.). In such an embodiment the example charged particle system(s) 102 may also include a second computing device 138 that is desktop computer separate from the example charged particle system(s) 102, and which is executable to process data received from one or both of the imaging sensor(s) 140 and microscope detection system 124 to generate images of the sample 104 and/or perform other types of analysis. The computing devices 138 may further be configured to receive user selections via a keyboard, mouse, touchpad, touchscreen, etc.

Figure 2:
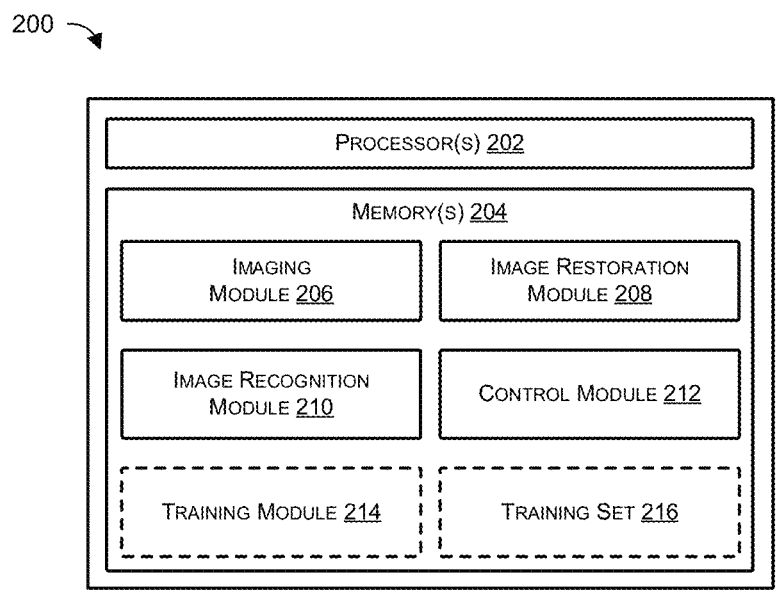
FIG. 2 depicts a schematic diagram illustrating an example computing architecture for TEM lamella preparation using image restoration algorithms for low keV FIB images in a charged particle system.

FIG. 2 depicts a schematic diagram illustrating an example computing architecture 200 for TEM lamella preparation using image restoration algorithms for low keV FIB images in a charged particle system. Example computing architecture 200 illustrates additional details of hardware and software components that can be used to implement the techniques described in the present disclosure. Persons having skill in the art would understand that the computing architecture 200 may be implemented in a single computing device or may be implemented across multiple computing devices. For example, individual modules and/or data constructs depicted in computing architecture 200 may be executed by and/or stored on different computing devices. In this way, different process steps of the inventive method according to the present disclosure may be executed and/or performed by separate computing devices.

In the example computing architecture 200, the computing device includes one or more processors 202 and memory 204 communicatively coupled to the one or more processors 202. The example computing architecture 200 can include an imaging module 206, an image restoration module 208, an image recognition module 210, a control module 212, and an optional training module 214 stored in the memory 204. The example computing architecture 200 is further illustrated as optionally including a training set 216 stored on memory 204. The training set 216 is a data structure (e.g., image, file, table, etc.) or collection of data structures that are used to train the image restoration module 208 and/or component machine learning algorithms thereof to restore images generated via irradiation with an ion beam source operating in a low keV mode.

For example, the training set 216 may include images of samples (e.g., TEM lamella) that have been generated via irradiation with an ion beam source operating in a low keV mode and where the features of the images (e.g., shadows, edges, fiducials, boundaries, structures, background features, sample features, etc.) have been labeled. Additionally, or in an alternative example, the training set 216 may include images of samples that have been generated via irradiation with an ion beam source operating in a low keV mode, and images of the same samples that have been generated via irradiation with an ion beam source operating in a high keV mode.

As used herein, the term "module" is intended to represent example divisions of executable instructions for purposes of discussion, and is not intended to represent any type of requirement or required method, manner or organization. Accordingly, while various "modules" are described, their functionality and/or similar functionality could be arranged differently (e.g., combined into a fewer number of modules, broken into a larger number of modules, etc.).

Further, while certain functions and modules are described herein as being implemented by software and/or firmware executable on a processor, in other instances, any or all of modules can be implemented in whole or in part by hardware (e.g., a specialized processing unit, etc.) to execute the described functions. As discussed above in various implementations, the modules described herein in association with the example computing architecture 200 can be executed across multiple computing devices.

The imaging module 206 can be executable by the processors 202 to receive sensor data from imaging sensors of a charged particle microscope system (e.g., charged particle system 102) and to generate images of a sample within the charged particle microscope system. In some embodiments, the images are grayscale images that show contrasts indicative of the shape and/or the materials of the sample (e.g., a TEM lamella). The sensor data is generated by the imaging sensors based on detection events that are resultant from the irradiation of the sample with a charged particle beam. For example, the sensor data can be generated based on detection of emissions from a sample being irradiated with an ion beam from a charged particle column (e.g., focused ion beam system 108). To prevent damage to the sample during irradiation, the charged particle column is set to operate in a low keV mode when irradiating the sample, which reduces the intensity of the charged particle beam as incident on the sample. While this reduction in beam intensity reduces damage to the sample, it also results in a reduced number of detection events and/or quality of the sensor data generated by the imaging sensors. This means that the images generated by the imaging module are generally low quality images (e.g., low detail, blurry, low resolution, etc.). This means that it is very difficult to determine the precise location of the sample in the generated images.

The image restoration module 208 can be executable by the processors 202 to generate a restored version of the image generated by the imaging module 206. The restored images are versions of the image generated by the imaging module 206 that have improved detail and/or resolution such that the sample, the background, and/or features thereof are able to be identified/located by a human or automated system. The image restoration module 208 comprises one or more image restoration models that are configured to generate restored versions of the images. Individual such image restoration models correspond to machine learning models (e.g., artificial neural network, convolutional neural network, recurrent neural network, supervised model, unsupervised model, etc.) that have been trained to restore an image of a sample (e.g., TEM lamella) that is generated via irradiation by a charged particle column is set to operate in a low keV mode. In some embodiments, the image restoration module 208 is executable to determine the best image restoration model and/or collection of image restoration models to apply to a particular image based on features of the image, settings/features of an associated charged particle microscope system, or both.

Once the image restoration model 208 generates such a restored image, the image recognition module 210 is executable by the processors 202 to identify features in the image (e.g., shadows, edges, fiducials, boundaries, structures, background features, sample features, etc.), the location and/or orientation of the sample in the restored image, or both. For example, the image restoration model 208 may first identify features within the restored image, and then determine the location of the sample in the restored image based on the identified features.

Once the location and/or orientation of the sample is determined in the restored image, the image recognition module 210 may be further executable to identify a region of the restored image that depicts an area that is to be subjected to polishing using a charged particle column operating in a low keV mode. This may include associating such a region of the restored image with a low energy mill mapping that describes the region of the image that is to be subjected to polishing by the charged particle column. The low energy mapping may correspond to coordinates that identify the pixels of the image that are included within the region, the boundaries of the region, etc. Alternatively, or in addition, the low energy mapping may be a graphic that is overlaid onto the restored image by a user, a computer algorithm, or a combination thereof. For example, a machine learning algorithm or other type of algorithm may overlay the low energy mapping graphic over the restored image based on the on ore more features identified in the image. Alternatively, the image recognition module 210 may present a graphical user interface that allows a user to place the low energy mapping graphic on the restored image, or approve the positioning of the low energy mapping graphic as overlaid automatically by the machine learning algorithm. In embodiments where a user is allowed to position the low energy mapping graphic on the restored image, the graphical user interface may present one or more overlay graphics to assist the user in correctly placing the low energy mapping graphic. For example, the overlay graphics may include an axis of the sample in the restored image, edges of the sample, boundaries of the sample, features of the sample, etc. The image recognition module 210 may be executable to automatically place the overlay graphics based on the determined features of the restored image.

The control module 212 can be executable by the processors 202 to cause a computing device and/or associated charged particle microscope system (e.g., charged particle system 102) to take one or more actions. For example, the control module 212 may cause an associated charged particle microscope system to reposition/orient a sample, scan a sample with an electron microscope column, irradiate a sample with a focused ion beam column, adjust the settings of a focused ion beam column or electron microscope column (e.g., adjust the voltage of the corresponding beam), adjust the optical settings of a focused ion beam column or electron microscope column, etc.

The control module 212 is further executable to cause the sample (e.g., a TEM lamella) to be polished using a charged particle column operating in a low keV mode based on the restored image, the low energy mapping, or a combination thereof. For example, the control module 212 may cause a charged particle column to operating in a low keV mode to irradiate regions of the sample corresponding to the portions of the restored image overlaid by a low energy mapping graphic.

The computing architecture 200 may optionally include a training module 214 that is executable to train the image restoration model 208, the image recognition module 210, and/or a component machine learning algorithm(s) thereof. The training module 214 facilitates the training of the image restoration model 208, the image recognition module 210, and/or a component machine learning algorithm(s) thereof based on a training set of one or more labeled images of similar and/or identical samples. The labels of the labeled images may include regions and/or points of the image that correspond to specific key points of a sample, sections of the image that correspond to groupings of pixels of a certain class (i.e., segmentation information). The training set of images may be labeled by an expert human operator, by a computing algorithm, or a combination thereof.

In some embodiments, the training module 214 may be configured to generate the training set of one or more labeled images from a single labeled image, a model, and/or a CAD drawing of the sample, etc. For example, the training module 214 may perform one or more morphing operations the labeled image, model, and/or CAD drawing to form a plurality of labeled morphed images. The training module 214 may be configured to perform additional training with new training data, and then transmit updates the improve the performance of the image restoration model 208, the image recognition module 210, and/or the component machine learning algorithm(s) thereof.

As discussed above, the computing architecture 200 includes one or more processors 202 configured to execute instructions, applications, or programs stored in a memory(s) 204 accessible to the one or more processors. In some examples, the one or more processors 202 may include hardware processors that include, without limitation, a hardware central processing unit (CPU), a graphics processing unit (GPU), and so on. While in many instances the techniques are described herein as being performed by the one or more processors 202, in some instances the techniques may be implemented by one or more hardware logic components, such as a field programmable gate array (FPGA), a complex programmable logic device (CPLD), an application specific integrated circuit (ASIC), a system-on-chip (SoC), or a combination thereof.

The memories 204 accessible to the one or more processors 202 are examples of computer-readable media. Computer-readable media may include two types of computer-readable media, namely computer storage media and communication media. Computer storage media may include volatile and non-volatile, removable, and non-removable media implemented in any method or technology for storage of information, such as computer readable instructions, data structures, program modules, or other data. Computer storage media includes, but is not limited to, random access memory (RAM), read-only memory (ROM), erasable programmable read only memory (EEPROM), flash memory or other memory technology, compact disc read-only memory (CD-ROM), digital versatile disk (DVD), or other optical storage, magnetic cassettes, magnetic tape, magnetic disk storage or other magnetic storage devices, or any other non-transmission medium that may be used to store the desired information and which may be accessed by a computing device. In general, computer storage media may include computer executable instructions that, when executed by one or more processing units, cause various functions and/or operations described herein to be performed. In contrast, communication media embodies computer-readable instructions, data structures, program modules, or other data in a modulated data signal, such as a carrier wave, or other transmission mechanism. As defined herein, computer storage media does not include communication media.

Those skilled in the art will also appreciate that items or portions thereof may be transferred between memory 204 and other storage devices for purposes of memory management and data integrity. Alternatively, in other implementations, some or all of the software components may execute in memory on another device and communicate with the computing devices. Some or all of the system components or data structures may also be stored (e.g., as instructions or structured data) on a non-transitory, computer accessible medium or a portable article to be read by an appropriate drive, various examples of which are described above. In some implementations, instructions stored on a computer-accessible medium separate from the computing devices may be transmitted to the computing devices via transmission media or signals such as electrical, electromagnetic, or digital signals, conveyed via a communication medium such as a wireless link. Various implementations may further include receiving, sending or storing instructions and/or data implemented in accordance with the foregoing description upon a computer-accessible medium.

Figure 3:
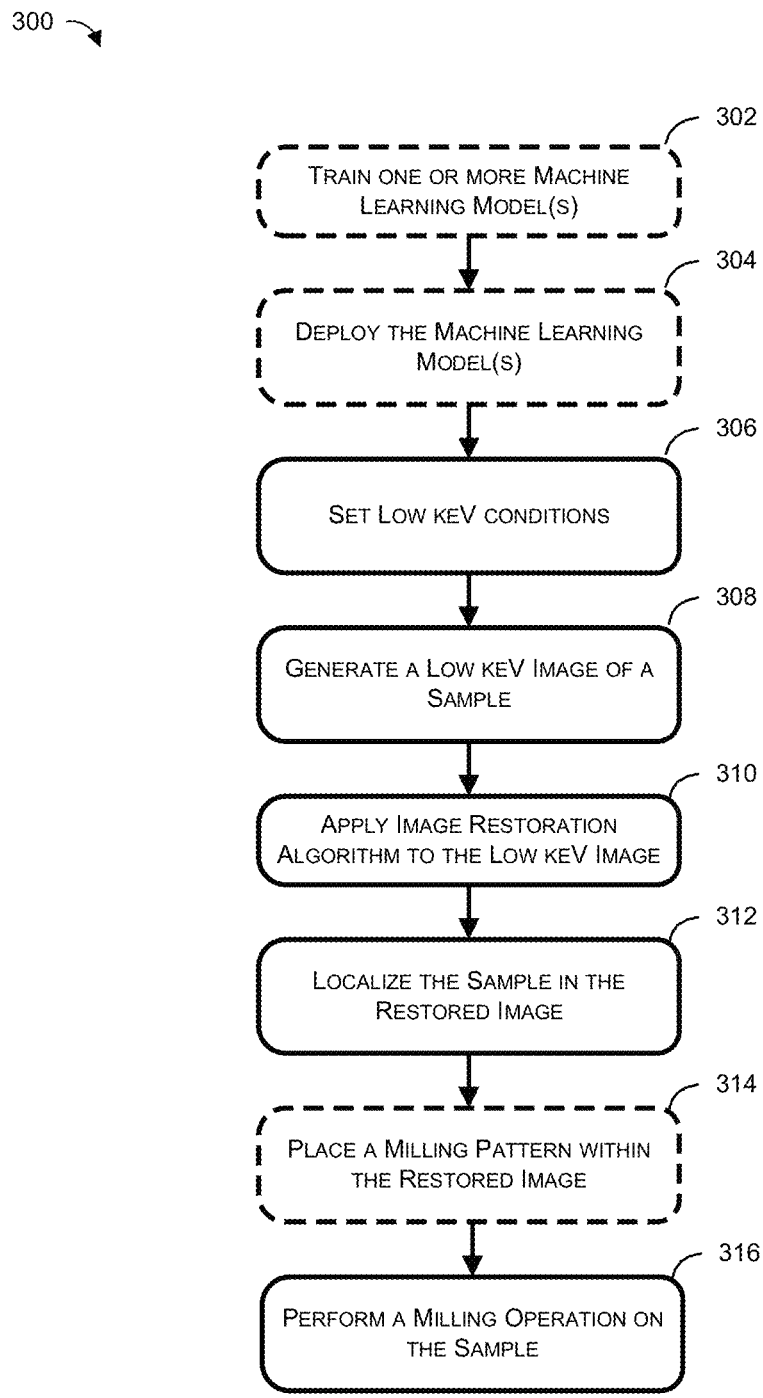
FIG. 3 shows a set of diagrams that illustrate a process for TEM lamella preparation using image restoration algorithms for low keV FIB images in a charged particle system.

FIG. 3 is a flow diagram of illustrative processes illustrated as a collection of blocks in a logical flow graph, which represent a sequence of operations that can be implemented in hardware, software, or a combination thereof. In the context of software, the blocks represent computer-executable instructions stored on one or more computer-readable storage media that, when executed by one or more processors, perform the recited operations. Generally, computer-executable instructions include routines, programs, objects, components, data structures, and the like that perform particular functions or implement particular abstract data types. The order in which the operations are described is not intended to be construed as a limitation, and any number of the described blocks can be combined in any order and/or in parallel to implement the processes.

Specifically, FIG. 3 is a flow diagram of an illustrative process 300 for TEM lamella preparation using image restoration algorithms for low keV FIB images in a charged particle system. The process 300 may be implemented in environment 100 and/or by one or more computing device(s) 138, and/or by the computing architecture 200, and/or in other environments and computing devices.

At 302, one or more machine learning models are trained to restore low keV images of samples and/or localize samples within restored images. Specifically, the machine learning models (e.g., CNNs, GANs, neural networks, etc.) are trained using training sets of one or more labeled images of similar and/or identical samples. The labels of the labeled images may include, but is not limited to, regions and/or points of the image that correspond to specific key points of a sample, sections of the image that correspond to groupings of pixels of a certain class (i.e., segmentation information). The training set of images may be labeled by an expert human operator, by a computing algorithm, or a combination thereof. For example, the training set may automatically be generated from a single labeled image, a model, and/or a CAD drawing of the sample by a computing algorithm that morphs and/or otherwise distorts the source labeled image/model/CAD drawing to form a plurality of labeled images. In some embodiments, the machine learning model(s) may be periodically retrained to improve performance.

At 304, the trained machine learning model(s) are optionally deployed. For example, may be trained by a central computing device and distributed to one or more consumer computing devices that are individually associated with corresponding charged particle microscope systems and executing the systems and methods disclosed herein. Additionally, where one or more of the machine learning model(s) are periodically retrained, updates may be transmitted to consumer computing devices executing the systems and methods disclosed herein to improve the performance of the machine learning models that have been previously deployed.

At 306, a focused ion beam column of a charged particle microscope system is set to low keV conditions (e.g., HV=2 keV, I=100 pA). When the charged particle microscope system is set to low keV conditions, an ion beam system within the charged particle microscope system is set to operate with operating values at or below 200 eV, 500 eV, 1 keV, 2 keV, 5 keV, 8 keV, and/or 16 keV. As discussed above, the charged particle column is set to operate in a low keV conditions so as to prevent damage to the sample during irradiation. That is, by reducing the landing energy of the charged particle beam, when irradiating the sample for imaging the charged particle beam causes the sample to emit emissions that can be detected by image sensors without causing structural damage to the sample. However, because of the lower energy of the charged particle beam, there are fewer emission events that are caused by the irradiation when compared to irradiation with a higher energy charged particle beam.

At 308, a low keV image of a sample in the charged particle microscope system is generated by the charged particle microscope system. Specifically, an imaging system of the charged particle microscope system generates an image of the sample within the charged particle microscope system. In various embodiments, the sample may correspond to but is not limited to being a TEM lamella. It is noted that because the low keV image is generated from detected emission events caused by the sample being irradiated by the focused ion beam column that is operating with low keV conditions the quantity and/or quality of the sensor data generated by the imaging sensors. This results in the low keV image of the sample is generally a low quality image (e.g., low detail, blurry, low resolution, etc.). For example, in the low keV, image the resolution may be such that it is very difficult to determine the precise location of the sample therein.

At 310, an image restoration algorithm is applied to the low keV image of the sample by the charged particle microscope system. Specifically, the charged particle microscope system applies an image restoration algorithm that generates a restored version of the low keV image that has improved detail and/or resolution such that the sample, the background, and/or features thereof are able to be identified/located by a human or automated system. The image restoration algorithm may include one or more machine learning models that have been trained to restore low keV images of the sample, such as those trained in step 302.

At 312, the sample is localized in the restored image. In some embodiments, the sample may be localized by a user of the charged particle microscope system. Alternatively, the image restoration algorithm may automatically locate the sample and/or assist the user in locating the sample based on features of the restored image. For example, the image restoration algorithm may be further executable to identify features in the restored image (e.g., shadows, edges, fiducials, boundaries, structures, background features, sample features, etc.), and then determine the location and/or orientation of the sample in the restored image. While step 312 is shown in method 300 as being separate from 310, in some embodiments the sample may be localized in parallel with and/or by the image restoration algorithm applied in step 310.

At 314, a milling pattern is optionally placed within the restored image. For example, the milling pattern may correspond to a graphic that is overlaid onto the restored image by a user, a computer algorithm, or a combination thereof, wherein the portion of the image that the milling pattern graphic overlays corresponds to a region of the image that is to be subjected to polishing by the charged particle column. In some embodiments, the milling pattern may be automatically placed by the charged particle microscope system or by a user thereof. For example, the charged particle microscope system may automatically place the milling pattern based on one or more features of the restored image. In an alternative embodiment, the charged particle microscope system may present a graphical user interface that allows a user to place a milling pattern graphic on the restored image, or approve the positioning of the low energy mapping graphic as overlaid automatically by the machine learning algorithm. In addition, where a user is allowed to position the low energy mapping graphic on the restored image, the graphical user interface may present one or more overlay graphics to assist the user in correctly placing the low energy mapping graphic.

At 316 a milling operation is performed on the sample by the charged particle microscope system. This may include, but is not limited to, polishing the sample. For example, polishing the sample may comprise the charged particle microscope system irradiating the sample with a focused ion beam system operating in a low keV mode such that the charged particle beam that only removes a small amount of material from the sample. In this way, damaged portions and/or deposits on the surface of the sample that are created during the production (i.e., milling) of the sample can be removed. Once polished, the sample may be analyzed by the charged particle microscope system.

Figure 4:
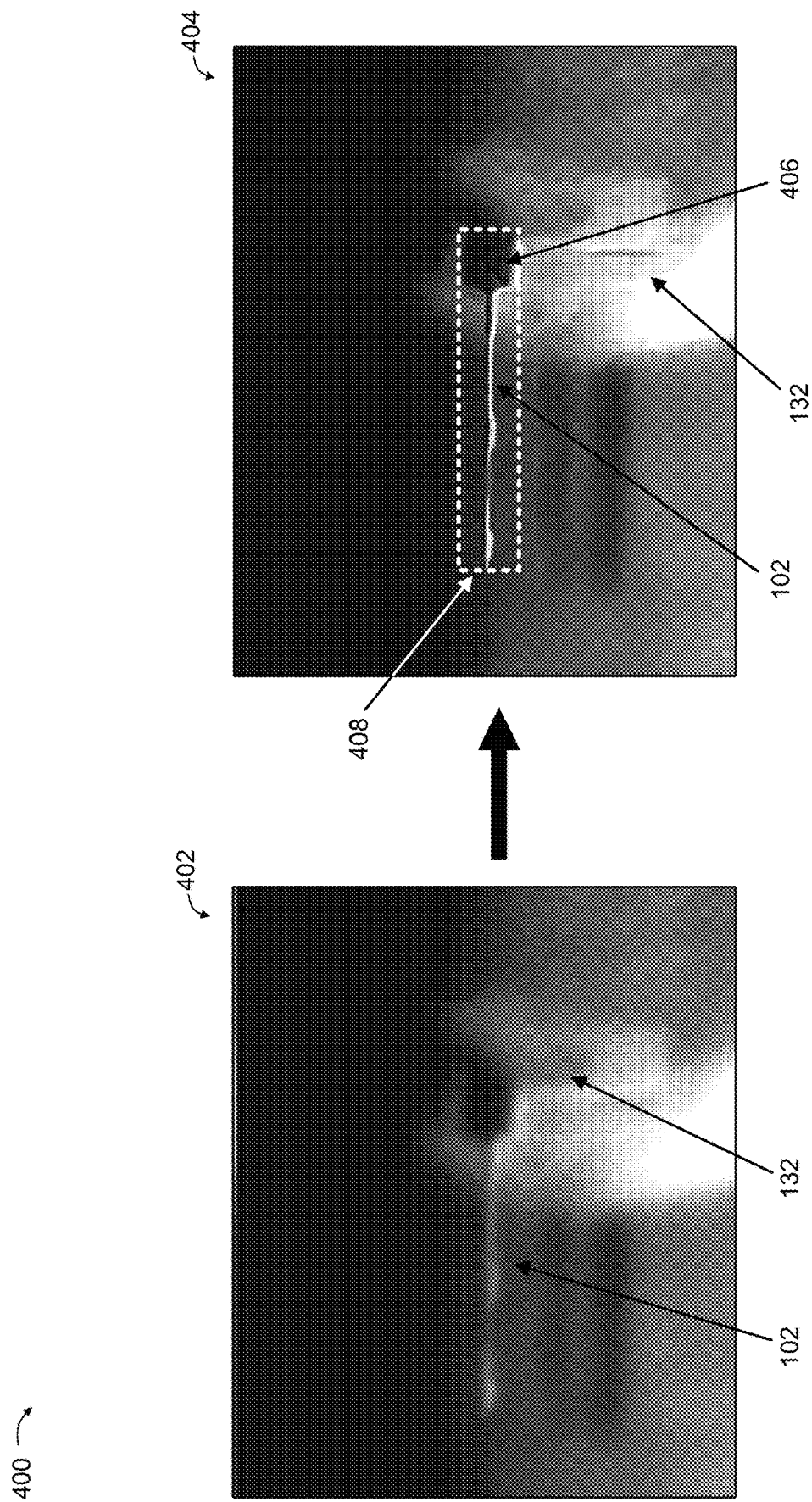
FIG. 4 is a diagram that illustrates the application of the systems and methods disclosed herein to locate a sample within a low keV image. according to the present invention to an image of a sample in a microscope image.

FIG. 4 illustrates the application 400 the systems and methods disclosed herein to locate a sample within a low keV image. according to the present invention to an image of a sample in a microscope image. FIG. 4 includes a low keV image 402 of a sample 102 within a charged particle microscope system that was generated by irradiating the sample with a focused ion beam operating in a low keV mode (e.g., HV=2 keV, I=100 pA). As can be seen in FIG. 4, the low keV image 402 is of very low quality, and thus it is difficult to determine the precise boundaries of the sample 102, or where the sample 102 ends and the sample holder 132 begins.

FIG. 4 also shows a restored version of the low keV image 404 that has been generated by a charged particle microscope system according to the present invention. As can be seen, the application of one or more image restoration algorithms (e.g., a CNN, a GAN, a neural network, etc.) has upscaled the resolution of the image so that the boundaries of the sample 102 and the sample holder 132 are clearly visible. Additionally, in the restored version of the low keV image 404 a fiducial 406 is visible that is completely undetectable in the low keV image 402. FIG. 4 further includes a low energy mapping graphic 408 that has been overlaid onto the restored version of the low keV image 404.

Examples of inventive subject matter according to the present disclosure are described in the following enumerated paragraphs.

A1. A method, comprising:
 irradiating a sample with an ion beam at low keV settings;
 generating a low keV ion beam image of the sample based on emissions resultant from irradiation by the ion beam;
 applying an image restoration model to the low keV ion beam image of the sample to generate a restored image;
 localize the sample within the restored image; and
 performing, based on the localized sample within the restored image, a low keV milling of the sample with the ion beam.

A1.1. The method of paragraph A1, wherein applying the image restoration model comprises applying a convolutional neural network (CNN).

A1.1.1. The method of paragraphs A1.1, wherein the machine learning model is one of a convolutional neural network (CNN), a generative adversary network (GAN), and/or a neural network.

A1.1.2. The method of any of paragraphs A1.1-A1.1.1, wherein the machine learning model is trained to recognize features of the sample and features of a background of the restored image, and wherein the sample is localized based on both the features of the sample and features of the background of the restored image.

A1.2. The method of any of paragraphs A1-A1.1.2, further comprising determining a best algorithm of a set of algorithms based on one or more microscope settings, and wherein applying the image restoration model comprises applying the best algorithm to the low keV ion beam image of the sample to generate the restored image.

A1.2.1. The method of paragraph A1.2, wherein the best algorithm is a machine learning model.

A1.2.2. The method of any of paragraphs A1.2-A1.2.1, wherein each algorithm of the set of algorithms is a machine learning model.

A1.3. The method of any of paragraphs A1-A1.2.2, further comprising determining a combination of algorithms from a set of algorithms based on one or more microscope settings, and wherein applying the image restoration model comprises applying the combination of algorithms to the low keV ion beam image of the sample to generate the restored image.

A2. The method of any of paragraphs A1-A1.3, further comprising examining and/or analyzing the sample with a charged particle microscope.

A3. The method of any of paragraphs A1-A2, wherein the sample is a lamella.

A3.1. The method of paragraph A3, wherein the lamella comprises a fiducial, and wherein the sample is located within the restored image based at least in part on the fiducial.

A4. The method of any of paragraphs A1-A3.1, further comprising generating the sample from a sample material using the ion beam, wherein generating the sample comprises:
 performing one or more milling steps on regions of the sample material to shape the sample with the ion beam;
 attaching the sample to a sample manipulation probe; and
 detaching the sample from the sample material with the ion beam.

A4.1. The method of paragraph A4, wherein the one or more milling steps are conducted with the ion beam operating at high keV settings.

A4.1.1. The method of paragraphs A4.1, wherein the high keV settings comprise the ion beam being set to operate with second operating values at or above 16 keV, 30 keV, and/or 50 keV.

A4.2. The method of any of paragraphs A4-A4.1, further comprising attaching the sample to a sample holder, and wherein irradiating the sample corresponds to irradiating the sample with the ion beam at low keV settings when the sample is attached to the sample holder.

A4.3. The method any of paragraphs A4-A4.2, wherein, when the sample is irradiated with the ion beam at low keV settings, a surface of the sample comprises damage caused by the ion beam during creation of the sample, and wherein the low keV milling of the sample with the ion beam removes the damage from the surface of the sample.

A5. The method of any of paragraphs A1-A4.3, further comprising setting the low keV settings for the ion beam.

A5.1. The method of any of paragraphs A1-A5, wherein the low keV settings comprise the ion beam being set to operate with operating values at or below 200 eV, 500 eV, 1 keV, 2 keV, 5 keV, 8 keV, and/or 16 keV.

A6. The method of any of paragraphs A1-A5.2, further comprising automatically identifying the sample in the restored image.

A6.1. The method of paragraph A6, wherein identifying features of the restored image, determining a position and/or orientation for the sample in the restored image based on the features.

A6.2. The method of any of paragraphs A6-A6.1, further comprising presenting to a user the restored image and/or the identified features of the restored image.

A7. The method of any of paragraphs A1-A6.2, wherein localizing the sample within the restored image comprises associating a region of the restored image that includes at least a portion of the sample with a low energy mill mapping.

A7.1. The method of paragraph A7, wherein the low energy mill mapping comprises a graphic that is placed onto the restored image, and wherein performing the low keV milling of the sample comprises subjecting a region of the sample that corresponds to the portion of the sample as depicted in the restored image that is covered by the graphic to the low keV milling with the ion beam.

A7.1.1. The method of paragraph A7.1, wherein the graphic is a rectangle.

A7.1.2. The method of any of paragraphs A7.1-A7.1.1, wherein the graphic is placed by a user via a user interface.

A7.1.3. The method of any of paragraphs A7.1-A7.1.2, wherein the graphic is automatically placed by the system.

A7.1.3.1. The method of paragraph A7.1.3, wherein the graphic is placed using an additional machine learning algorithm.

A7.1.3.2. The method of paragraph A7.1.3, wherein the graphic is placed using an edge finding algorithm.

A7.1.3.3. The method of paragraph A7.1.3, wherein the graphic is placed using template matching.

A7.1.3.4. The method of paragraph A7.1.3, wherein the graphic is placed using feature based matching.

A7.1.3.4. The method of any of paragraphs A7.1.3-A7.1.3.2, wherein further comprising presenting, on a graphical user interface, the restored image with the graphic automatically placed by the system and a request for approval, and wherein the low keV milling of the sample is performed based at least in part on a reception of approval.

A8. The method of any of paragraphs A1-A7.1.3.3, wherein performing the low keV milling of the sample with the ion beam comprises performing a cutting step with the ion beam.

B1. A charged particle microscope system, comprising:
a sample holder configured to hold a sample;
an ion source configured to irradiate the sample with an ion beam;
an imaging system configured to capture images of the sample based on charged particles emitted by the sample in response to being irradiated with the ion beam;
one or more processing units; and
a memory storing computer readable instructions that, when executed by the one or more processing units, cause the charged particle microscope system to perform the methods of any of paragraphs A1-A8.

C1. Use of the charged particle microscope system of paragraph B1.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "determine," "identify," "produce," and "provide" to describe the disclosed methods. These terms are high-level abstractions of the actual operations that are performed. The actual operations that correspond to these terms will vary depending on the particular implementation and are readily discernible by one of ordinary skill in the art.

What is claimed is:

1. A method, comprising:
performing one or more milling steps on regions of a sample material to shape the sample material to form a sample with an ion beam operating at high keV settings;
attaching the sample to a sample manipulation probe;
detaching the sample from the sample material with the ion beam;
irradiating the sample with the ion beam at low keV settings;
generating a low keV ion beam image of the sample based on emissions resultant from irradiation by the ion beam;
applying an image restoration model to the low keV ion beam image of the sample to generate a restored image;
localizing the sample within the restored image; and
performing, based on the localized sample within the restored image, a low keV milling of the sample with the ion beam.

2. The method of claim 1, wherein applying the image restoration model comprises applying at least one machine learning model, the at least one machine learning model comprising one or more neural networks.

3. The method of claim 2, wherein the machine learning model is trained to identify features of the restored image, the features comprising features of the sample and features of a background of the restored image.

4. The method of claim 3, wherein identifying the features of the restored image comprises determining a position and orientation for the sample in the restored image based on the features of the restored image.

5. The method of claim 1, further comprising:
determining a best algorithm of a set of algorithms based on one or more microscope settings; and
wherein applying the image restoration model comprises applying the best algorithm to the low keV ion beam image of the sample to generate the restored image.

6. The method of claim 1, further comprising:
determining a combination of algorithms from a set of algorithms based on one or more microscope settings; and
wherein applying the image restoration model comprises applying the combination of algorithms to the low keV ion beam image of the sample to generate the restored image.

7. The method of claim 1, further comprising examining the sample with a transmission electron microscope.

8. The method of claim 1, wherein the sample is a TEM lamella.

9. The method of claim 8, wherein the TEM lamella comprises a fiducial, and wherein the sample is located within the restored image based at least in part on the fiducial.

10. The method of claim 1, wherein the one or more milling steps include irradiating portions of the sample material with the ion beam at high keV settings, wherein:
the low keV settings comprise the ion beam being set to operate with first operating values at or below 200 eV, 500 eV, 1 keV, 2 keV, 5 keV, 8 keV, and/or 16 keV; and
the high keV settings comprise the ion beam being set to operate with second operating values at or above 16 keV, 30 keV, and/or 50 keV.

11. The method of claim 1, wherein, when the sample is milled with the ion beam at low keV settings, a surface of the sample that comprises damage caused by the ion beam during generation of the sample is removed.

12. The method of claim 1, wherein localizing the sample within the restored image comprises associating a region of the restored image that includes at least a portion of the sample with a low energy mill mapping.

13. The method of claim 12, wherein the low energy mill mapping comprises a graphic that is placed onto the restored image, and wherein performing the low keV milling of the sample comprises subjecting a region of the sample that corresponds to a portion of the restored image that is covered by the graphic to the low keV milling with the ion beam.

14. The method of claim 13, wherein the graphic is automatically placed by the system using an additional machine learning algorithm.

15. The method of claim 14, wherein further comprising presenting, on a graphical user interface, the restored image with the graphic automatically placed by the system and a request for approval, and wherein the low keV milling of the sample is performed based at least in part on a reception of approval.

16. A charged particle microscope system, comprising:
a sample holder configured to hold a sample material;
a ion source configured to irradiate the sample with an ion beam;
an imaging system configured to capture images of the sample based on charged particles emitted by the sample in response to being irradiated with the ion beam;
one or more processing units; and
a memory storing computer readable instructions that, when executed by the one or more processing units, cause the charged particle microscope system to:
perform one or more milling steps on regions of the sample material to shape the sample material to form a sample with the ion beam at high keV settings;
attach the sample to a sample manipulation probe;
detach the sample from the sample material with the ion beam;
irradiate the sample with the ion beam at low keV settings;
generate a low keV ion beam image of the sample based on emissions resultant from irradiation by the ion beam;
apply an image restoration model to the low keV ion beam image of the sample to generate a restored image;
localize the sample within the restored image; and
perform, based on the localized sample within the restored image, a low keV milling of the sample with the ion beam.

17. The charged particle microscope system of claim 16, wherein localizing the sample within the restored image comprises overlaying a graphic over the restored image, and wherein performing the low keV milling of the sample comprises subjecting a region of the sample that corresponds to a portion of the restored image that is covered by the graphic to the low keV milling with the ion beam.

18. The charged particle microscope system of claim 16, wherein the low keV settings comprise the ion beam being set to operate with first operating values at or below 200 eV, 500 eV, 1 keV, 2 keV, 5 keV, 8 keV, and/or 16 keV, and the high keV settings comprise the ion beam being set to operate with second operating values at or above 16 keV, 30 keV, and/or 50 keV.

19. The charged particle microscope system of claim 16, wherein, when the sample is milled with the ion beam at low keV settings, a surface of the sample that comprises damage caused by the ion beam during creation of the sample is removed.

20. A method, comprising:
performing one or more milling steps on regions of a sample material to shape the sample material to shape a sample with an ion beam operating at high keV settings;
attaching the sample to a sample manipulation probe;
detaching, after the sample is attached to the sample manipulation probe, the sample from the sample material with the ion beam;
irradiating, after the sample is detached from the sample material, the sample with the ion beam at low keV settings;
generating a low keV ion beam image of the sample based on emissions resultant from irradiation by the ion beam;
applying an image restoration model to the low keV ion beam image of the sample to generate a restored image;
localizing the sample within the restored image; and
performing, based on the localized sample within the restored image, a low keV milling of the sample with the ion beam.

* * * * *